US012618873B1

(12) United States Patent 
Shier et al.

(10) Patent No.: US 12,618,873 B1 
(45) Date of Patent: May 5, 2026

(54) PARTAILLY GUARDED SWITCHING MATRIX FOR AUTOMATIC ELECTRONIC TEST EQUIPMENT

(71) Applicant: DIT-MCO International LLC, Kansas City, MO (US)

(72) Inventors: David Alan Shier, Lee's Summit, MO (US); Patrick Noll, Plattsberg, MO (US)

(73) Assignee: DIT-MCO International LLC, Kansas City, MO (US)

( * ) Notice: Subject to any disclaimer, the term of this patent is extended or adjusted under 35 U.S.C. 154(b) by 0 days.

(21) Appl. No.: 19/381,728

(22) Filed: Nov. 6, 2025

Related U.S. Application Data

(60) Provisional application No. 63/717,797, filed on Nov. 7, 2024.

(51) Int. Cl. 
 *G01R 31/58*   (2020.01) 
 *G01R 1/18*   (2006.01) 
 *G01R 1/20*   (2006.01) 
 *G01R 27/26*   (2006.01) 
(52) U.S. Cl. 
 CPC ............... *G01R 1/206* (2013.01); *G01R 1/18* (2013.01); *G01R 27/2605* (2013.01); *G01R 31/58* (2020.01) 
(58) Field of Classification Search 
 CPC . G01R 27/2605; G01R 31/58; G01R 27/2617

USPC .......................................................... 324/519 
See application file for complete search history.

(56) References Cited

U.S. PATENT DOCUMENTS

| | | | |
|---|---|---|---|
| 6,064,218 A | 5/2000 | Godfrey et al. | |
| 6,496,015 B2 * | 12/2002 | Stanford | G01R 31/1272 |
| | | | 324/508 |
| 9,261,533 B2 | 2/2016 | Rashidzadeh et al. | |

FOREIGN PATENT DOCUMENTS

JP   H0742944  8/1995

* cited by examiner

*Primary Examiner* — Roberto Velez 
(74) *Attorney, Agent, or Firm* — Pauly, DeVries Smith & Deffner LLC

(57) ABSTRACT

Systems and Methods for capacitance testing of a unit under test with parasitic capacitance directed to a guard rail. The system includes test points, wherein the plurality of test points are divided into at least two groups; a stimulus source; a first group guard relay electrically connected to each of the test points in a first; a second group guard relay electrically connected to each of the test points in a second; a guard rail coupled to the first group guard relay and the second group guard relay; a first group return relay electrically connected to each of the test points in a first group; a second group return relay electrically connected to each of the test points in a second group; a current measurement rail coupled to the first group return relay and the second group return relay; a current meter coupled to the measurement rail; and a controller.

20 Claims, 12 Drawing Sheets

PARTAILLY GUARDED SWITCHING MATRIX FOR AUTOMATIC ELECTRONIC TEST EQUIPMENT

RELATED APPLICATIONS

This application claims the benefit of U.S. Provisional Application No. 63/717,797, filed Nov. 7, 2024, the content of which is incorporated herein by reference in its entirety.

FIELD

Embodiments herein relate to systems and methods that analyze electrical wiring harness assemblies.

BACKGROUND

Switching matrices are well known in the design of automatic electronic test equipment. In the case of wire/harness test systems, these matrices consist of a large number of electro-mechanical relays. Typically, two relays are required for each test point connected to the Unit Under Test (UUT). The first relay provides the stimulus output, and the second relay is used for the return side of the circuit. As these test systems utilize DC, or very low frequency AC stimulus, in order to minimize cost, the relays and the surrounding circuits are unshielded.

Such designs are typical for continuity, resistance, and isolation testing. However, when measuring capacitance, the parasitic capacitance of the circuits associated with the open relays, and the isolated wiring in the UUT, can overwhelm the measurement.

SUMMARY

One method for reducing the effect of parasitic capacitance is to connect circuits that are to be isolated from the measurement to a guard network that connects directly to the return side of the stimulus source, bypassing the current measurement circuit. This method requires a third relay for each test point. While the result is a fully guarded network, this arrangement is typically considered prohibitively expensive, given the 50% premium in relay count simply for the single use case of capacitance measurements. Generally, there is a need to provide the ability to reduce the amount of parasitic capacitance during capacitance testing without requiring a third relay for each test point.

Methods and systems to provide a level of guarding without the need for the extra relays are therefore desirable.

In an embodiment, a system for capacitance testing of a unit under test (UUT), can be included having a plurality of test points, each test point associated with an input relay and an output relay, such that the number of test points can be equivalent to the number of input relays and the number of output relays, wherein the plurality of test points can be divided into at least two groups, a stimulus source configured to provide a stimulus signal, a stimulus rail, the stimulus rail electrically connected to each of the test points via the associated input relays, wherein the stimulus rail can be electrically connected to the stimulus source, a first group guard relay electrically connected to each of the test points in a first group via the associated output relays, a second group guard relay electrically connected to each of the test points in a second group via the associated output relays, a guard rail, the guard rail coupled to the first group guard relay and the second group guard relay, a first group return relay electrically connected to each of the test points in a first group via the associated output relays, a second group return relay electrically connected to each of the test points in a second group via the associated output relays, a current measurement rail, the current measurement rail coupled to the first group return relay and the second group return relay, a current meter coupled to the current measurement rail, and a controller operably coupled to the stimulus source, the input relays, the output relays, the guard relays, the return relays, and the current meter.

In an embodiment, wherein, in response to a test request between a first point in the second group and a second point in the second group, the controller can be configured to (i) actuate the input relay for the first point to a closed position and the output relay for the first point to an open position, (ii) actuate the output relay for the second group to a closed position, (iii) actuate the input relays for the test points in the first group to an open position, (iv) actuate the output relays for the test points in the first group to a closed position, (v) actuate the remaining input relays associated with test points in the second group to an open position, (vi) actuate the remaining output relays associated with test points in the second group to an open position, (vii) actuate the first group guard relay to a closed position, (viii) actuate the first group return relay to an open position, (ix) actuate the second group guard relay to an open position, (x) actuate the second group return relay to a closed position, (xi) provide a stimulus via the stimulus source, and (xii) measure a return signal with the current meter.

In an embodiment, the controller can be further configured to actuate all of the input relays of a group of test points not associated with a current test to an open position and all of the output relays of a group of test points not associated with the current test to a closed position.

In an embodiment, the system can further include a first group stimulus relay and a second group stimulus relay, wherein the stimulus rail includes a first group stimulus rail and a second group stimulus rail, the first group stimulus rail electrically connected to each of the input relays for the test points in the first group via first group stimulus relay, the second group stimulus rail electrically connected to each of the input relays for the test points in the second group via second group stimulus relay.

In an embodiment, the controller can be further configured to implement a test by actuating a subset of input relays and a subset of output relays for only the test points associated with the measurement, leaving all other input or output relays in a state such that parasitic currents can be redirected to the guard rail.

In an embodiment, the number of groups can be greater than two, and the system further includes a corresponding group guard relay and a group return relay for each group.

In an embodiment, the guard rail can be connected to a ground.

In an embodiment, wherein each input relay and each output relay includes a solid-state relay or an electromechanical relay.

In an embodiment, wherein there can be at least eight test points.

In an embodiment, the system can further include a memory element operably coupled to the controller, wherein the memory element can be configured to log results of multiple capacitance measurements.

In an embodiment, the system can be configured to measure capacitance in picofarads.

In an embodiment, a system for capacitance testing of a unit under test (UUT), can be included having a plurality of test points, each test point associated with an input relay and an output relay, such that the number of test points can be equivalent to the number of input relays and the number of output relays, wherein the plurality of test points can be divided into at least two groups, a stimulus source configured to provide a stimulus signal, a first stimulus rail, the first stimulus rail electrically connected to each of the test points in the first group via the associated input relays, wherein the first stimulus rail can be electrically connected to the stimulus source via a first group stimulus relay, a second stimulus rail, the first stimulus rail electrically connected to each of the test points in the second group via the associated input relays, wherein the first stimulus rail can be electrically connected to the stimulus source via a second group stimulus relay, a first group guard relay electrically connected to each of the test points in a first group via the associated output relays, a second group guard relay electrically connected to each of the test points in a second group via the associated output relays, a guard rail, the guard rail coupled to the first group guard relay and the second group guard relay, a first group return relay electrically connected to each of the test points in a first group via the associated output relays, a second group return relay electrically connected to each of the test points in a second group via the associated output relays, a current measurement rail, the current measurement rail coupled to the first group return relay and the second group return relay, a current meter coupled to the current measurement rail, and a controller operably coupled to the stimulus source, the input relays, the output relays, the guard relays, the return relays, and the current meter.

In an embodiment, wherein, in response to a test request between a first point in the second group and a second point in the second group, the controller can be configured to (i) actuate the input relay for the first point to a closed position and the output relay for the first point to an open position, (ii) actuate the output relay for the second group to a closed position, (iii) actuate the first group stimulus relay to a closed position, (iv) actuate the second group stimulus relay to an open position, (v) actuate the input relays for the test points in the first group to an open position, (vi) actuate the output relays for the test points in the first group to a closed position, (vii) actuate the remaining input relays associated with test points in the second group to an open position, (viii) actuate the remaining output relays associated with test points in the second group to an open position, (ix) actuate the first group guard relay to a closed position, (x) actuate the first group return relay to an open position, (xi) actuate the second group guard relay to an open position, (xii) actuate the second group return relay to a closed position, (xiii) provide a stimulus via the stimulus source, and (xiv) measure a return signal with the current meter.

In an embodiment, the controller can be further configured to actuate all of the input relays of a group of test points not associated with a current test to an open position and all of the output relays of a group of test points not associated with the current test to a closed position.

In an embodiment, the controller can be further configured to implement a test by actuating a subset of input relays and a subset of output relays for only the test points associated with the measurement, leaving all other input or output relays in a state such that parasitic currents can be redirected to the guard rail.

In an embodiment, the number of groups can be greater than two, and the system further includes a corresponding group guard relay and a group return relay for each group.

In an embodiment, the guard rail can be connected to a ground.

In an embodiment, wherein each input relay and each output relay includes a solid-state relay or an electromechanical relay.

In an embodiment, wherein there can be at least eight test points.

In an embodiment, can further include a memory element operably coupled to the controller, wherein the memory element can be configured to log results of multiple capacitance measurements.

In an embodiment, a method of conducting a capacitance test for a unit under test (UUT) using a switching matrix that includes a plurality of test points divided into at least two groups, each test point associated with an input relay and an output relay, a stimulus source coupled to a stimulus rail, a guard rail coupled to a first group guard relay and a second group guard relay, a current measurement rail coupled to a first group return relay and a second group return relay, and a current meter coupled to the current measurement rail, the method can be included, the method receiving a test request to measure capacitance between a first test point and a second test point within a selected one of the groups, actuating an input relay for the first test point to a closed position and an output relay for the first test point to an open position, actuating an input relay for the second test point to an open position and an output relay for the second test point to a closed position, actuating input relays for test points in a non-selected group to open positions and actuating output relays for test points in the non-selected group to closed positions, actuating remaining input relays associated with test points in the selected group to open positions and actuating remaining output relays associated with test points in the selected group to open positions, actuating a guard relay for the non-selected group to a closed position and actuating a return relay for the non-selected group to an open position, actuating a guard relay for the selected group to an open position and actuating a return relay for the selected group to a closed position, providing a stimulus via the stimulus source to the stimulus rail, and measuring a return signal with the current meter to determine capacitance between the first test point and the second test point, wherein parasitic currents from test points not associated with the current test can be redirected to the guard rail and bypass the current meter.

In an embodiment, the method can further include using configuration data to automatically configure the grouping of the test points prior to initiating a test.

In an embodiment, can further include the step of logging the measured capacitance value with a time-stamp in a memory element operably coupled to the controller.

In an embodiment, the memory element stores settings, data, and results associated with each test performed.

In an embodiment, the method can further include running additional capacitance tests between different combinations of test points, wherein parasitic capacitance from test points not included in the group or groups of the points being tested can be directed to the guard rail.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope herein is defined by the appended claims and their legal equivalents.

BRIEF DESCRIPTION OF THE FIGURES

Aspects may be more completely understood in connection with the following figures (FIGS.), in which.

While embodiments are susceptible to various modifications and alternative forms, specifics thereof have been shown by way of example and drawings, and will be described in detail. It should be understood, however, that the scope herein is not limited to the particular aspects described. On the contrary, the intention is to cover modifications, equivalents, and alternatives falling within the spirit and scope herein.

DETAILED DESCRIPTION

The present disclosure provides systems, apparatus, and methods for implementing a partially guarded switching matrix within automatic electronic test equipment, such as for capacitance measurements of multi-point wiring harness assemblies. The described embodiments are directed to minimizing the influence of parasitic capacitance attributable to unselected or unmeasured test points in automatic test environments, without incurring the full cost and complexity associated with equipping each test point with a dedicated guarding relay.

Aspects of various embodiments include the division of all available test points into at least two (and optionally more) groups, with each group associated with its own guard relay and return relay. The guard relay can be used to direct current from groups that do not include a test point to a guard rail. The guard rail can bypass the current measurement elements. As a result, the system can avoid measuring parasitic capacitance from groups that do not include a test point that is currently being tested.

Figure 1:
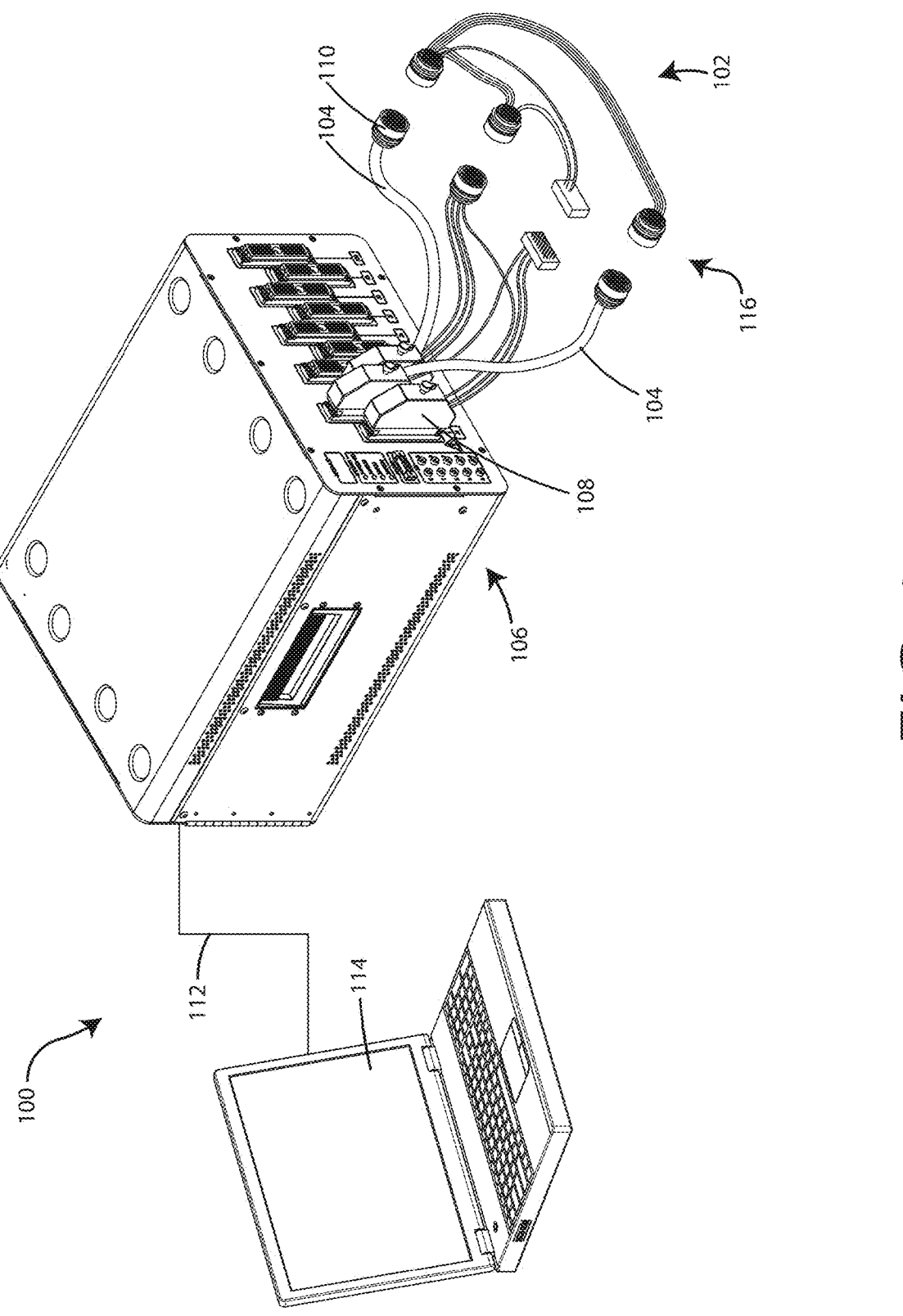
FIG. 1 is a perspective view of a testing system in accordance with various embodiments herein.

In reference now to FIG. 1, the testing system 100 according to various embodiments is shown. The system 100 may be provided for testing and analyzing an electrical wiring harness assembly 102, such as for capacitance testing. In some embodiments, the system 100 can be configured to measure capacitance in picofarads. The electrical wiring harness assembly 102 may include one or more cables, connectors, switches, relays, resistors, diodes, or the like with one or more nodes, such as multi-node wire harnesses. A schematic of an example electrical wiring harness assembly 102 is depicted in FIG. 2.

The testing system 100 can include a plurality of adapter cables 104. Each adapter cable 104 can include an analyzer connector 108 for connecting the adapter cable 104 to a connector on the analyzer 106. In various embodiments, an adapter cable 104 can include a plurality of wire harness connectors 110 for connecting the adapter cable 104 to an electrical wiring harness 102 via a connector on the electrical wiring harness 102. The wire harness connector 110 can be configured to contact two or more pins of the electrical wiring harness 102, such as to create electrical communication.

The testing system 100 can include an analyzer 106, which can include a stimulus source and measurement device. The analyzer 106 can be further configured to measure electrical characteristics of the electrical wiring harness assembly 102. The analyzer 106 is electrically connected to the wiring harness 102 via one or more adapter cables 104. The analyzer 106 or stimulus source can be configured to create a signal (e.g., output signal) for a wiring harness 102 being tested. The analyzer 106 can be configured to read or measure a return signal (e.g., input signal). The analyzer 106 can be configured to execute a test, such as a capacitance test, an insulation test or a hipot test. In various embodiments provided herein, the analyzer 106 is configured to conduct to a capacitance test.

Figure 2:
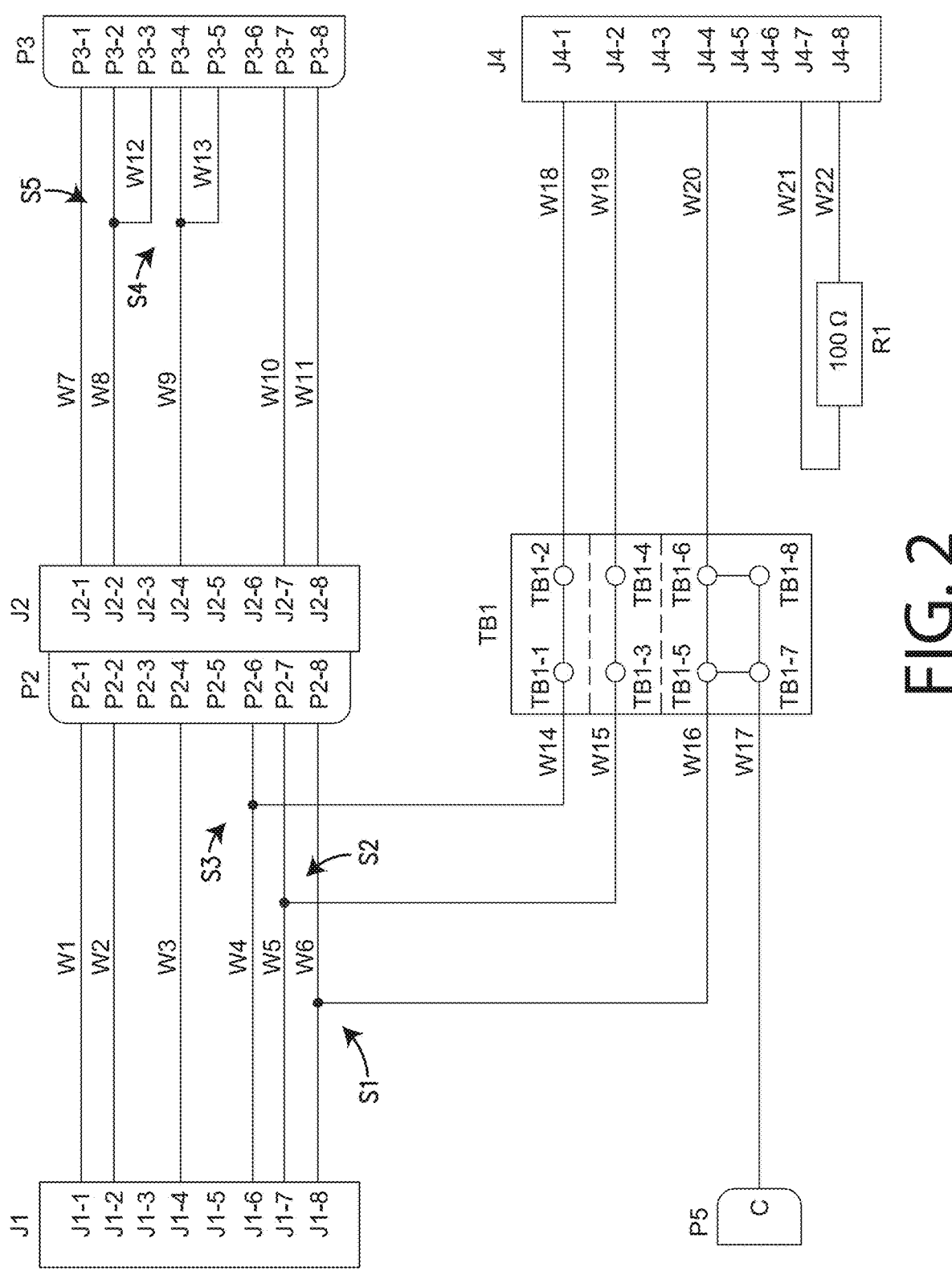
FIG. 2 is a schematic diagram of the unit under test in FIG. 1 in accordance with various embodiments herein.
Figure 3:
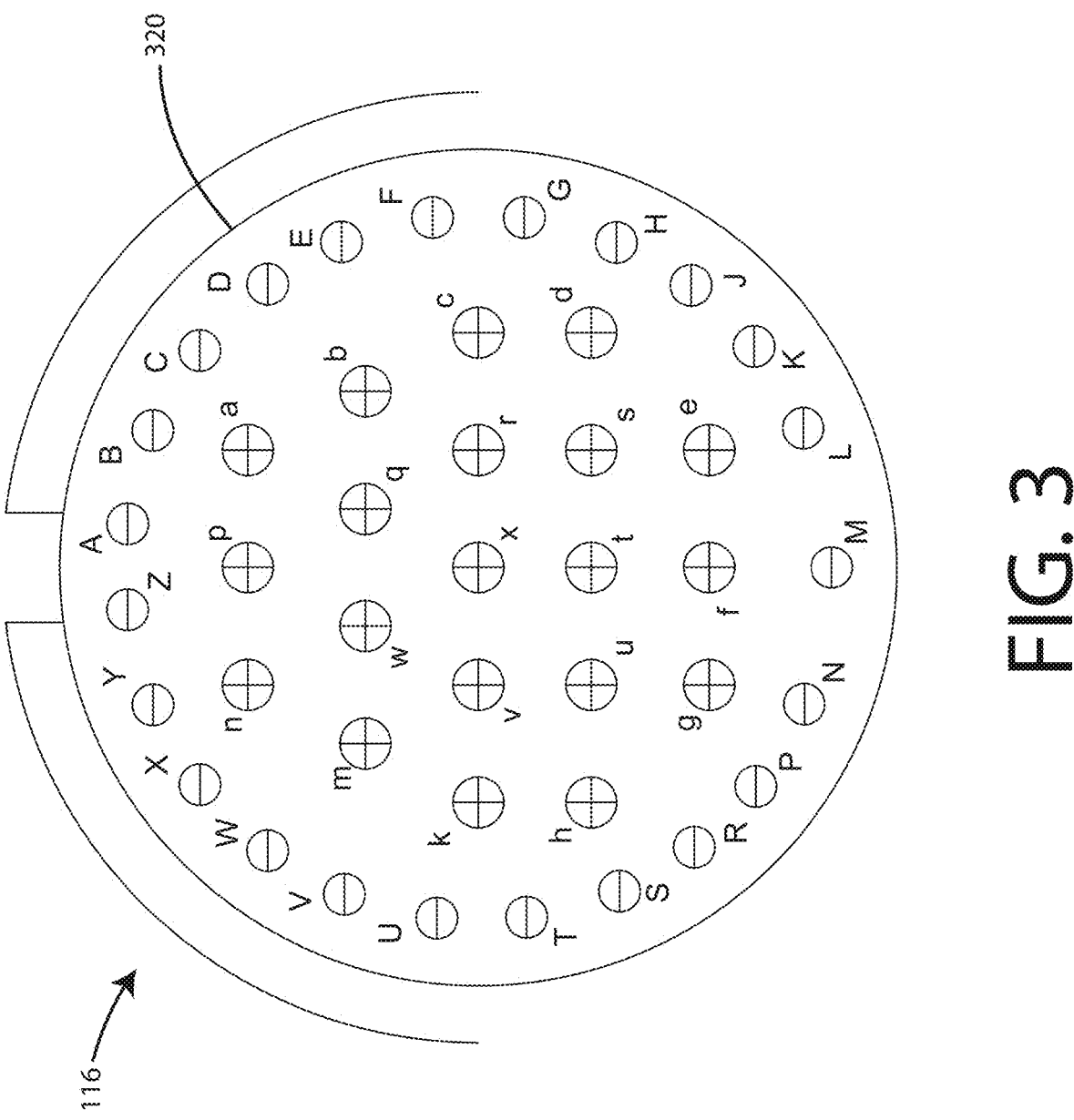
FIG. 3 is a schematic diagram of a topology of a contact arrangement of the unit under test of FIG. 1 in accordance with various embodiments herein.

In reference now to FIG. 2, a schematic of an electrical wiring harness assembly 102 is shown in accordance with various embodiments. The electrical wiring harness assembly 102 can include connectors J1, J2, J4, P2, P3, P5, terminal block TB1, wires W1, W2, W3, W4, W5, W6, W7, W8, W9, W10, W11, W12, W13, W14, W15, W16, W17, W18, W19, W20, W21, W22, resistor R1, and splices S1, S2, S3, S4, S5 as shown in FIG. 2. The connectors J1, J2, J4, P2, P3 can each include a number of contacts: connector J1 includes contacts J1-1, J1-2, J1-3, J1-4, J1-5, J1-6, J1-7, and J1-8; connector P2 includes contacts P2-1 through P2-8; connector J2 includes contacts J2-1 through J2-8; etc. Connector P5 may include a "coax" connector, with a single center contact "C" and a shield connected to ground (not depicted). Terminal block TB1 can include a number of contacts TB1-1, TB1-2 . . . , TB1-8, and a number of internal interconnections TB1-1-2, TB1-3-4, TB1-5-6, TB1-5-7, TB1-6-8, TB1-7-8. The electrical wiring harness assembly 102 can include a harness or mating connector 116 for connecting to analyzer 106 via the adapter cable 104. An exemplary contact arrangement 320 for the harness is depicted in FIG. 3 with contacts A, B, C, D, E, F, G, H, J, K, L, M, N, P, R, S, T, U, V, W, X, Y, Z, a, b, c, d, e, f, g, h, k, m, n, p, q, r, s, t, u, v, W, X.

Figure 4:
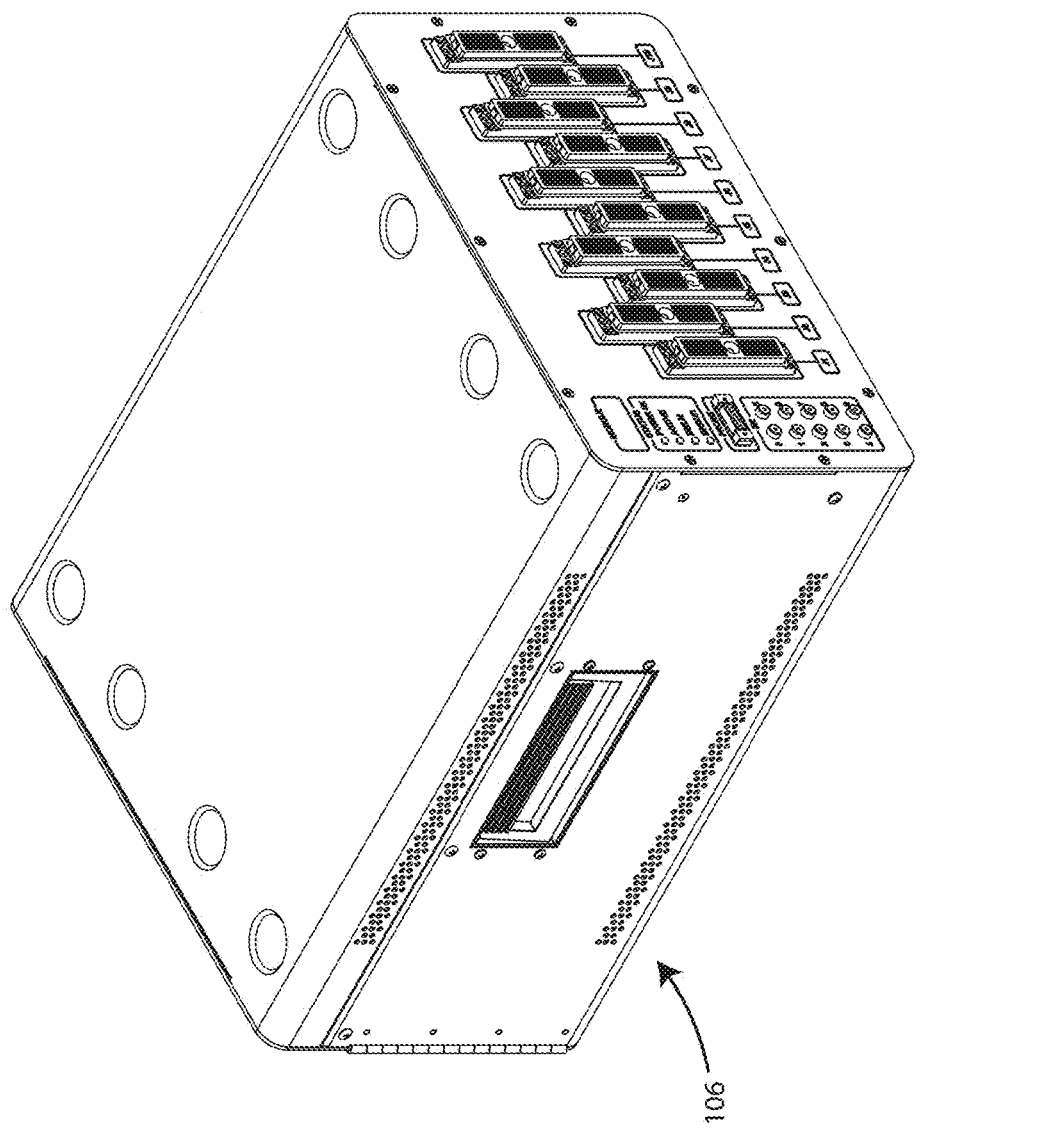
FIG. 4 is a perspective view of a stimulus and measurement device of the test system of FIG. 1 in accordance with various embodiments herein.
Figure 5:
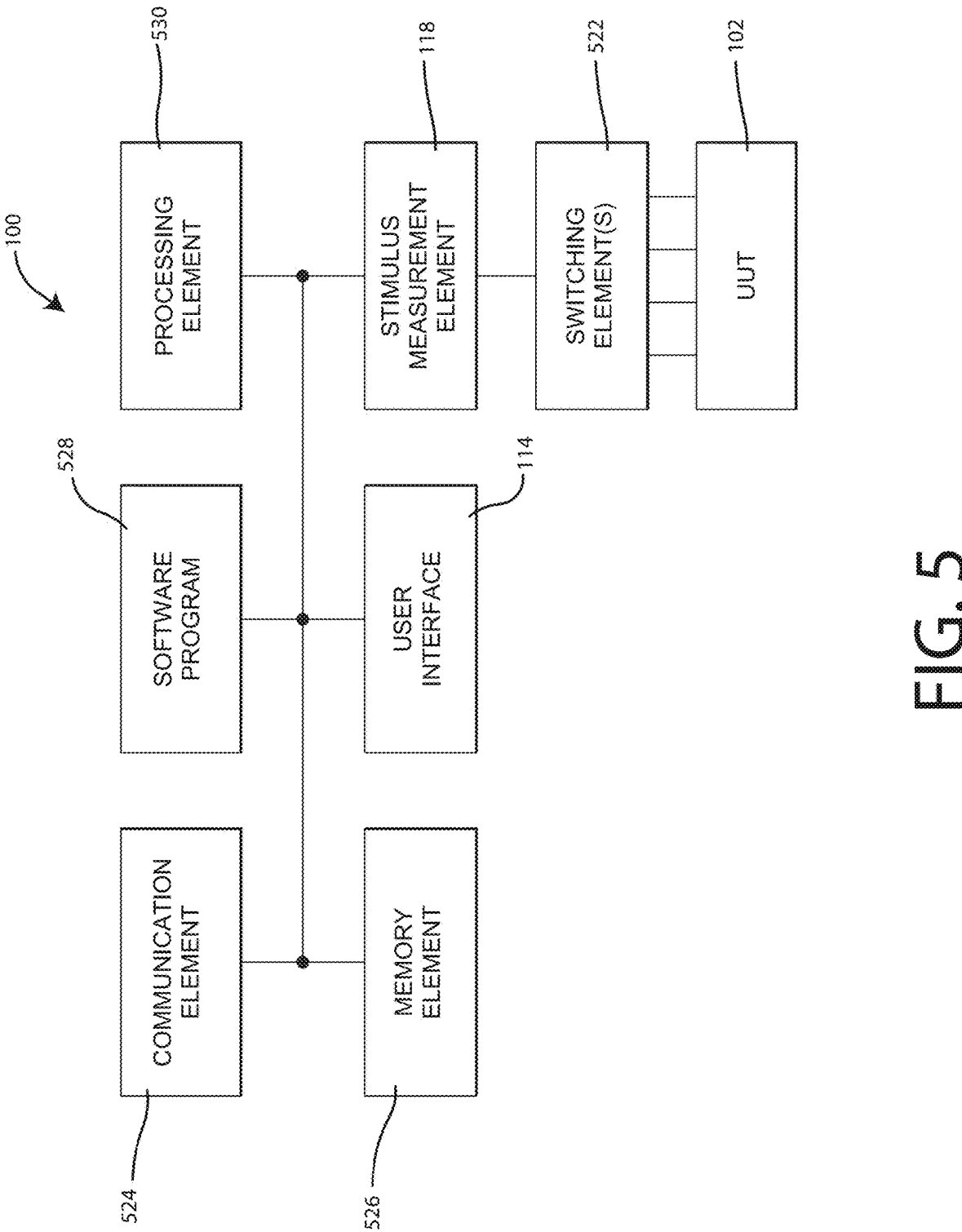
FIG. 5 is a schematic diagram depicting select components of the test system of FIG. 1 in accordance with various embodiments herein.

Turning to FIGS. 4 and 5, the system 100 broadly includes an analyzer 106, a switching element 522 (shown in FIG. 5), a user interface 114, a communication element 524, a memory element 526, a software program 528, and a processing element 530. An adapter cable 104 can be configured to connect to the wire harness 102 through the wire harness connector 110 of the adapter cable 104 mating with the connector 116 of the electrical wiring harness assembly 102.

The analyzer 106 is configured to generate a signal for performing tests on the electrical wiring harness assembly 102. The analyzer 106 may be configured to generate a voltage, current, waveform, or the like, and measure various electrical properties of the electrical wiring harness assembly 102 in response to the stimuli. The switching element 522 is configured to connect the analyzer 106 to the wire harness interface 102. The switching element 522 may comprise a switching matrix, such as a switch module, or pluralities thereof. In some embodiments, the switching element 522 may be integrated into the analyzer 106. In some embodiments, the switching element 522 may comprise a switch module connected to the analyzer 106 and/or the adapter cables 104.

The user interface 114 generally allows the user to utilize inputs and outputs to interact with the system 100. The user interface 114 may be in communication with the analyzer 106 via a wired and/or wireless connection, as schematically represented by line 112 in FIG. 1. The wired or wireless connection 112 may comprise an ethernet cable, a USB cable, a Wi-Fi connection, a Bluetooth™ connection, or any of the communication techniques described below in connection with the communication element 524. Inputs may include buttons, pushbuttons, knobs, jog dials, shuttle dials, directional pads, multidirectional buttons, switches, keypads, keyboards, mice, joysticks, microphones, touch screens, mouse pads, or the like, or combinations thereof. Outputs may include audio speakers, lights, dials, meters, printers, screens, displays, or the like, or combinations thereof. With the user interface 114, the user may be able to control the features and operation of what is displayed. While FIG. 1 depicts the testing system 100 as comprising various components integrated in separate housings, the components of the testing system 100 may be integrated and/or connected in any number of ways without departing from the scope of the present invention. For example, in some embodiments, all the components of the system 100 may be integrated into a single device with a single housing.

The communication element 524 generally allows communication between the system 100 and other testing systems, external devices, laptops, computers, or the like. The communication element 524 may include signal or data transmitting and receiving circuits, such as antennas, amplifiers, filters, mixers, oscillators, digital signal processors (DSPs), and the like. The communication element 524 may establish communication wirelessly by utilizing radio frequency (RF) signals and/or data that comply with communication standards such as cellular 2G, 3G, 4G or 5G, Institute of Electrical and Electronics Engineers (IEEE) 802.11 standard such as WiFi, IEEE 802.16 standard such as WiMAX, Bluetooth™, or combinations thereof. In addition, the communication element 524 may utilize communication standards such as ANT, ANT+, Bluetooth™ low energy (BLE), the industrial, scientific, and medical (ISM) band at 2.4 gigahertz (GHz), or the like. Alternatively, or in addition, the communication element 524 may establish communication through connectors or couplers that receive metal conductor wires or cables, like Cat 6 or coax cable, which are compatible with networking technologies such as ethernet. In certain embodiments, the communication element 524 may also couple with optical fiber cables. The communication element 524 may be in communication with the user interface 114, the memory element 526, and/or processing element 530.

The memory element 526 may include electronic hardware data storage components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 526 may be embedded in, or packaged in the same package as, the processing element 530. The memory element 526 may include, or may constitute, a "computer-readable medium." The memory element 526 may store the instructions, code, code segments, software, firmware, programs, applications, apps, services, daemons, or the like that are executed by the processing element 530. In an embodiment, the memory element 526 stores the software application/program 528. The memory element 526 may also store settings, data, documents, sound files, photographs, movies, images, databases, and the like.

The processing element 530 may include electronic hardware components such as processors. The processing element 530 may include microprocessors (single-core and multi-core), microcontrollers, digital signal processors (DSPs), field-programmable gate arrays (FPGAs), analog and/or digital application-specific integrated circuits (ASICs), or the like, or combinations thereof. The processing element 530 may generally execute, process, or run instructions, code, code segments, software, firmware, programs, applications, apps, processes, services, daemons, or the like. For instance, the processing element 530 may execute the software application/program 528. The processing element 530 may also include hardware components such as finite-state machines, sequential and combinational logic, and other electronic circuits that can perform the functions necessary for the operation of the current invention. The processing element 530 may be in communication with the other electronic components through serial or parallel links that include universal busses, address busses, data busses, control lines, and the like.

The processing element 530 is configured to perform one or more tests on the electrical wiring harness assembly 102 via the switching element 522 and the adapter cable(s) 104, analyze the results, and output the results in various forms, such as in natural language via the user interface 114 or recording of results in a log in the memory element 526. For example, the processing element 530 may be configured to determine prospective insulation leakage errors between networks that should be isolated from each other in the electrical wiring harness assembly 102. For each error, the processing element 530 may be configured to access a database of wiring diagrams and display a wiring diagram for one or more networks that have been determined have an error associated with them. The processing element 530 may be configured to report probable error type in natural language via the user interface 114. The reporting may comprise displaying the natural language on a display of the user interface 114, printing the natural language via a paper printer of the user interface 114, outputting the natural language to a data file, or the like. In response to determining an error exists, a user can be notified of the error and then fix the error.

Various embodiments provided herein utilize the existing output relays associated with each test point to either route to the current measurement circuit or the guard rail. In many embodiments, one or more of the stimulus, the return, and the guard circuits are split into two rails, such as one connected to even numbered test points (i.e., a first group), and the second connected to odd numbered test points (i.e., a second group). It should be understood that the test points could be separated into other groups instead of odd and even, such as the first half of points connected to one rail and the second half of the points connected to the second rail. In various embodiments, test points can be grouped randomly (e.g. test points 0, 2, 3, 7, and 9 are in one group and test points 1, 4, 5, 6, and 8 are in a second group) or sequentially (e.g. test points 0-4 are in one group and test points 5-9 are in a second group). It should be further understood that the test points do not specifically need to be separated into two groups of equal numbers. As an example, the first rail could be connected to five test points and the second rail could be connected to three test points. While the figures show all of the test points being connected to two rails, it is possible in some embodiments to have more than two rails, such as three, four, five or more rails. However, each rail requires an additional relay. In various embodiments, the number of rails is less than the number of test points.

While testing points have been shown and described as split into EVENs (i.e. first group) and ODDs (i.e. second group) for the two groups and have equal number of test points in each group, it should be understood that these divisions are shown and described as one example. In other embodiments, there can be more than two groups, more than three groups, more than four groups, more than five groups, more than six groups or more than ten groups. More groups results in additional guarding, but results in increased costs due to the need for additional relays. In some embodiments, the number of groups is less than the number of test points. In some embodiments, the number of groups is at less half of the number of test points. In some embodiments, there are at least 2 test points, at least 4 test points, at least 5 test points, at least 8 test points, at least 10 test points, at least 20 test points, at least 30 test points, at least 40 test points, or at least 50 test points in each group.

As an example, for capacitance testing, one test point connected to the UUT is routed to the stimulus rail, and another test point connected to the UUT is routed to the current measurement device in series with the return side of the stimulus. If the return side point has an even address, then the EVEN RETURN relay, and the ODD GUARD relay are closed on the relevant switching board. Then all odd numbered INPUT relays on the board that are not associated with either network on the UUT are also closed. This guards out as much as half the circuits connected to the switching board (in the shown embodiment including an equal number of test points connected to each rail).

Figure 8:
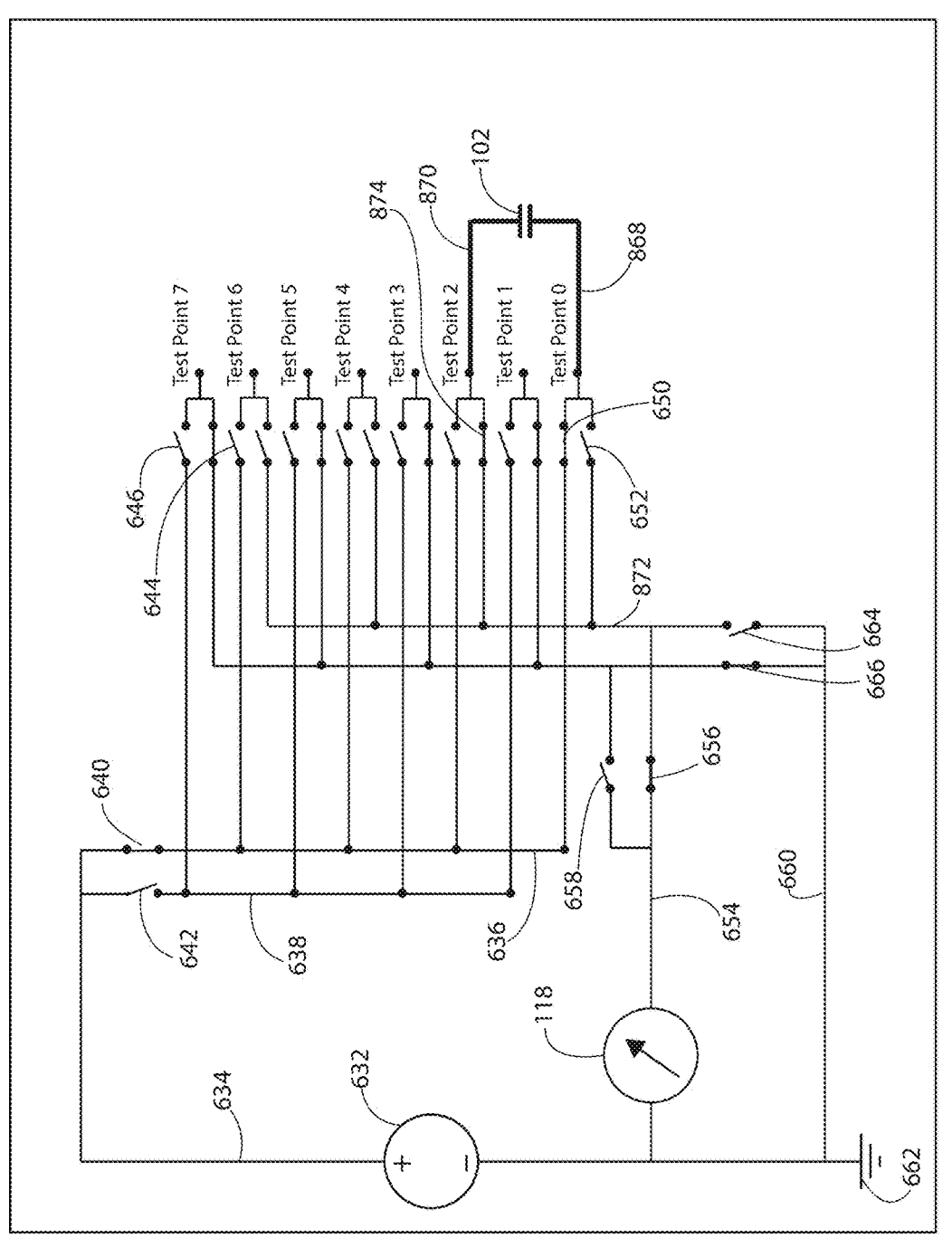
FIG. 8 is a schematic of an electrical circuit in accordance with various embodiments herein.
Figure 9:
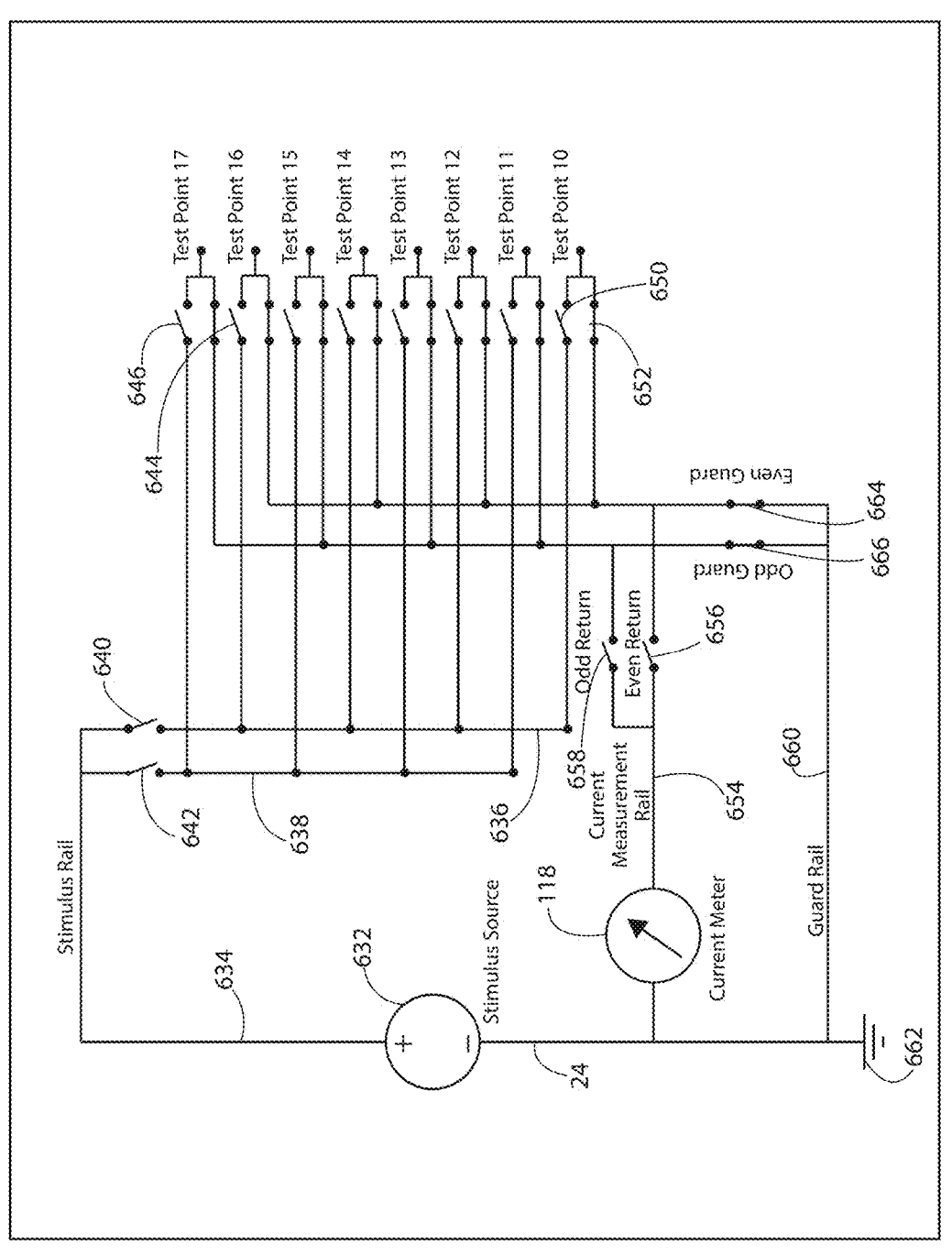
FIG. 9 is a schematic of an electrical circuit in accordance with various embodiments herein.

In most cable/harness test systems, a plurality of switching boards are needed to connect to the UUT. If more than one switching board is utilized, then on all switching boards that do not contain the return-side test point, both the ODD and EVEN guard relays are closed, and any test points that do not have direct connection to either of the two networks on the UUT currently under test, have their associated INPUT relays closed. This method guards out 100% of the parasitic capacitance on such switching boards. This is shown in FIGS. 8-9. FIG. 9 shows a switching board representative of switching boards that are not associated with any of the test points, such as where test points in FIG. 8 are being tested. In some embodiments, a system can include at least two switching boards, at least three switching boards, at least five switching boards, at least ten switching boards, at least twenty switching boards, at least fifty switching boards, or at least one hundred switching boards.

While a fully guarded switching matrix for a single board provides superior reduction in parasitic capacitance when compared to the presently disclosed embodiments, it does so at a much higher cost due to the required additional relays. The current embodiments provide a substantially high level of guarding without the high cost per test point. Further, each relay requires additional physical space and additional power. As such, the reduction of relays compared to including an additional guarding relay for each test point reduces the amount of physical space required as well as the amount of power required.

Figure 6:
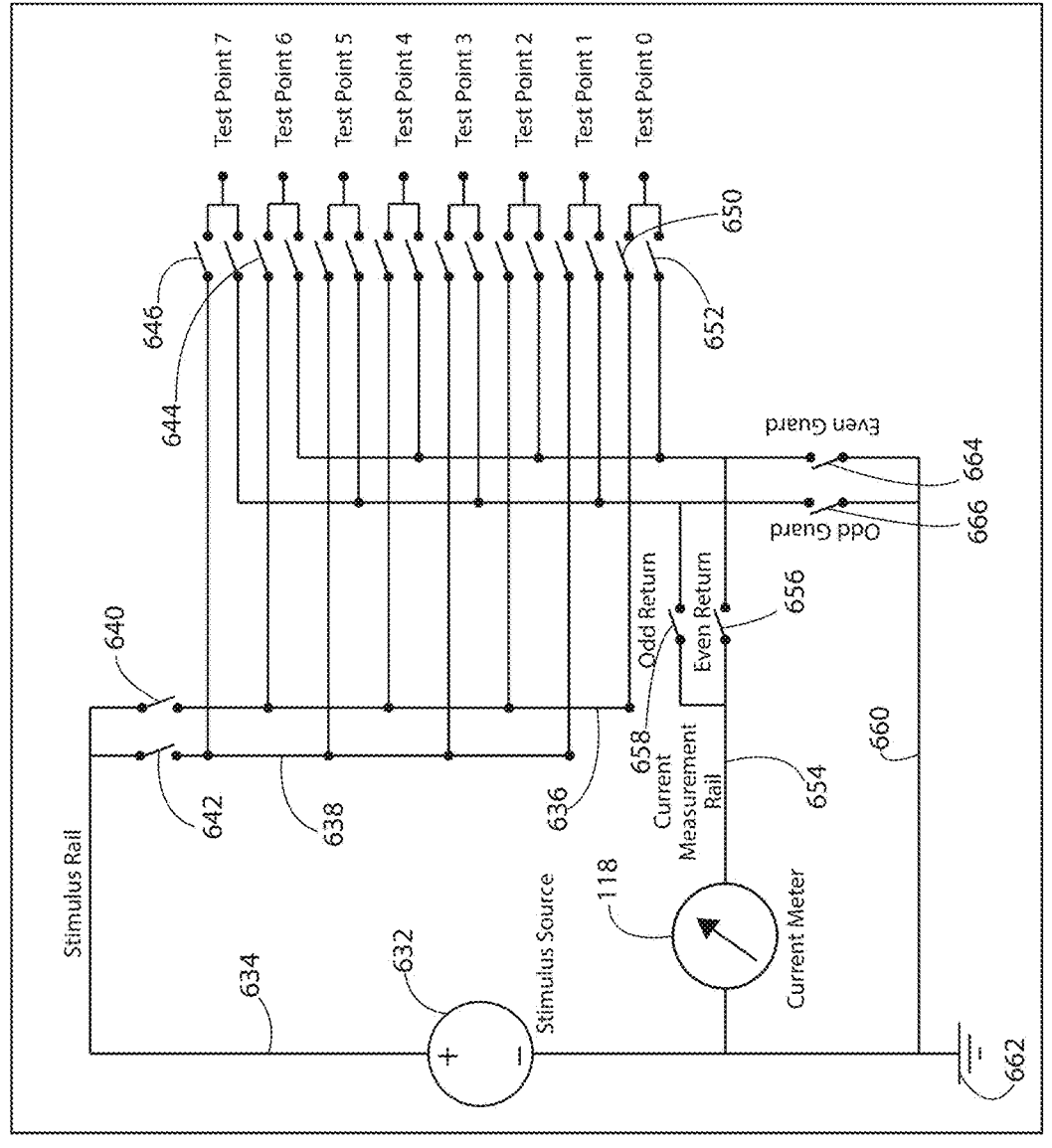
FIG. 6 is a schematic of an electrical circuit in accordance with various embodiments herein.

FIG. 6 provides an illustration of an example of various embodiments. A stimulus source 632, connects to a source rail or stimulus rail 634, which can be connected either to a first group rail 636 or a second group rail 638 through either relay 640 or 642 respectively. The first group (shown as EVEN) and the second group (shown as ODD) stimulus rails 636, 638 are connected to INPUT relays of the first group test points and the second group test points represented by relays 644 and 646 respectively.

As mentioned previously, the test points can be separated into groups other than odd and even, and the number of test points do not need to be equal in for each rail. Further, in some embodiments, the test points could be separated into more than two groups. In such embodiments, more than two guard relays would be required, since each group will require a guard relay.

The return side of the stimulus source 632, connects to a stimulus measurement element or current meter 118, which in turn connects to the main current measurement rail 654. The current measurement rail is connected to output relays of the first and second groups of test points, represented by 644 and 646 respectively through the first group return relay 656 and the second group return relay 658.

A guard rail 660 can also be connected to the return side of the stimulus source 632, but bypasses the current meter 118, such that any current returning to the stimulus source from the guard rail is not included in any measurement. In various embodiments, the guard rail is connected to a ground.

The guard rail is also connected to the analog ground 662 of the test system 100, such that any parasitic currents also bypass the current meter 118.

The first guard relay 664 and the second guard relay 666 can connect the guard rail 660 to the first group (i.e., even) and second group (i.e., odd) output relays 652.

Figure 7:
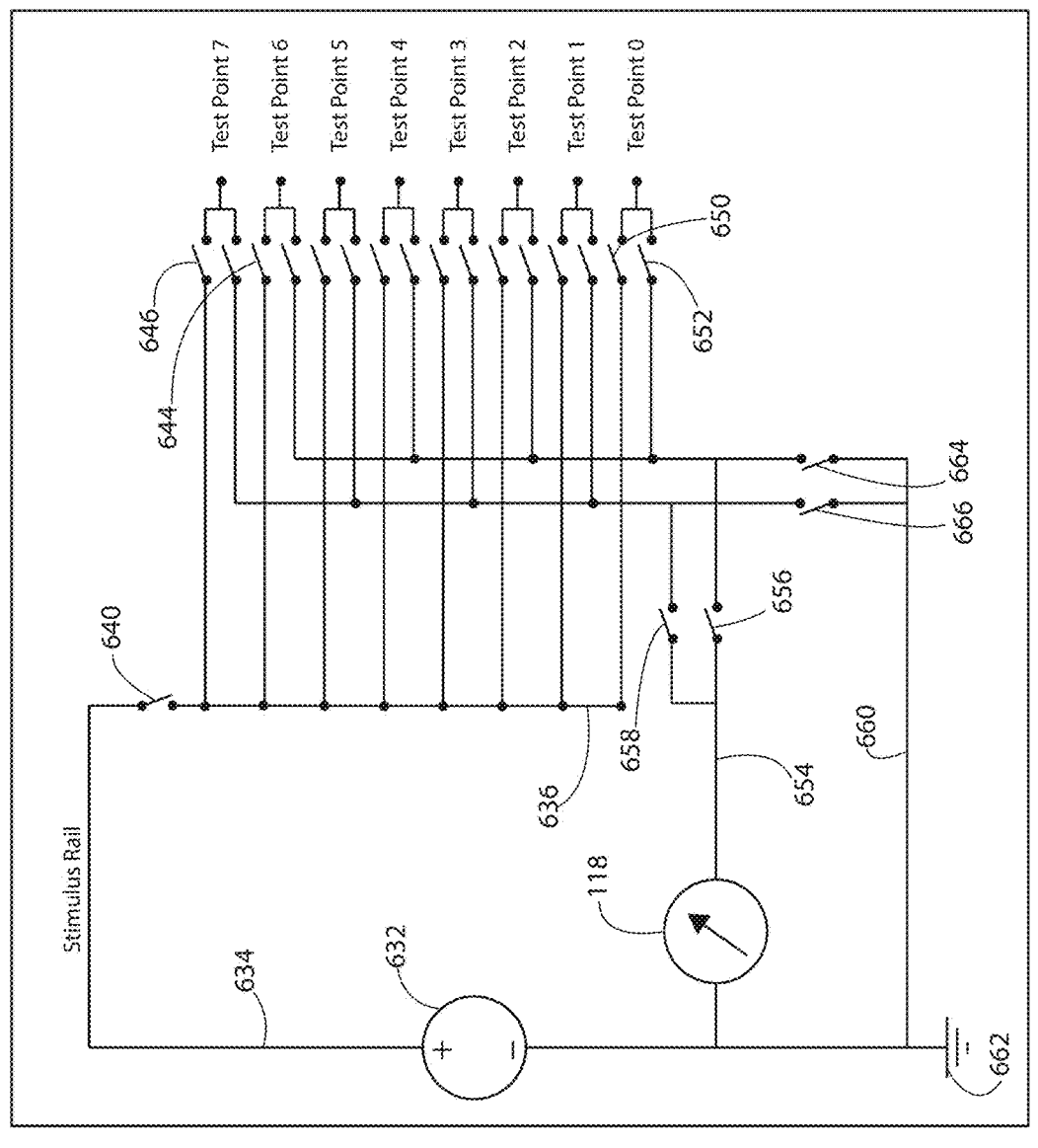
FIG. 7 is a schematic of an electrical circuit in accordance with various embodiments herein.

In various embodiments, a single stimulus rail 634 can be connected to all of the input relays for the test points, such as shown in FIG. 7. In various embodiments, a single stimulus relay 640 can be included, such as also shown in FIG. 7. Despite FIGS. 6 and 8-9 showing two stimulus rails with two stimulus relays, the guarding properties provided by various embodiments herein can be realized with a single stimulus rail 634 with or without a single stimulus relay 640. The process of routing capacitance or current from non-tested test points to the guard rail can be provided without multiple stimulus rails and/or stimulus relays.

In various embodiments, each group can have its own stimulus relay, such that the number of stimulus relays can be equal to the number of groups. In other embodiments, the number of groups is less than the number of stimulus relays, such as when multiple groups are connected to the same stimulus relay. In various embodiments, each card has its own stimulus relay. In various embodiments, each card can be connected to the same stimulus source 632, such as through a common stimulus rail 634.

Similarly, in various embodiments, each group can have its own return relay 656 and its own guard relay 666. Each test point can have its own input relay 650 and output relay 652.

FIGS. 8 and 9 show an example of a test of UUT 102, specifically test point 0 and test point 2. FIG. 8 provides a simplified illustration of various embodiments where the capacitance between two test points of the UUT 102 connected between "Test Point 0" 868, and "Test Point 2" 870 is being measured. In this example, the first group stimulus rail 636 is connected to the Stimulus rail 634 by closing the first group stimulus relay 640. The "Test Point 0" input relay 650 is closed to connect to the positive side of the UUT 102 under the capacitance test. Similarly, the first group return relay 656 (i.e., EVEN return relay) is closed, which connects the first group return bus 872 to the current measurement rail 654, and the output relay of "Test Point 2" 874 is closed to complete the circuit through the current meter 118 and the return side of the stimulus source 632. Since the return-side test point in this example is part of the first group ("Test Point 2"), the second group guard relay 666 and the output relays 652s of all the test points in the second group are closed. Any parasitic capacitive, or resistive leakage between the stimulus and any of the second group test points is directly connected to the return side of the stimulus source 632, and therefore is not measured since it bypasses the current meter 118. FIG. 9 provides a schematic of a switching board in an instance of various embodiments where the capacitance to be measured is not connected to any switching point on the illustrated switching board. In this case, all of the test points represent potential parasitic capacitive, or resistive current. For such instances, both the first group guard relay 664 and the second group guard relay 666 are closed, and all input relays 650 associated with the test points on such boards are opened. Thus, all parasitic current from the board bypasses the current meter 118 in completing the circuit to the return side of the stimulus source 632.

Figure 10:
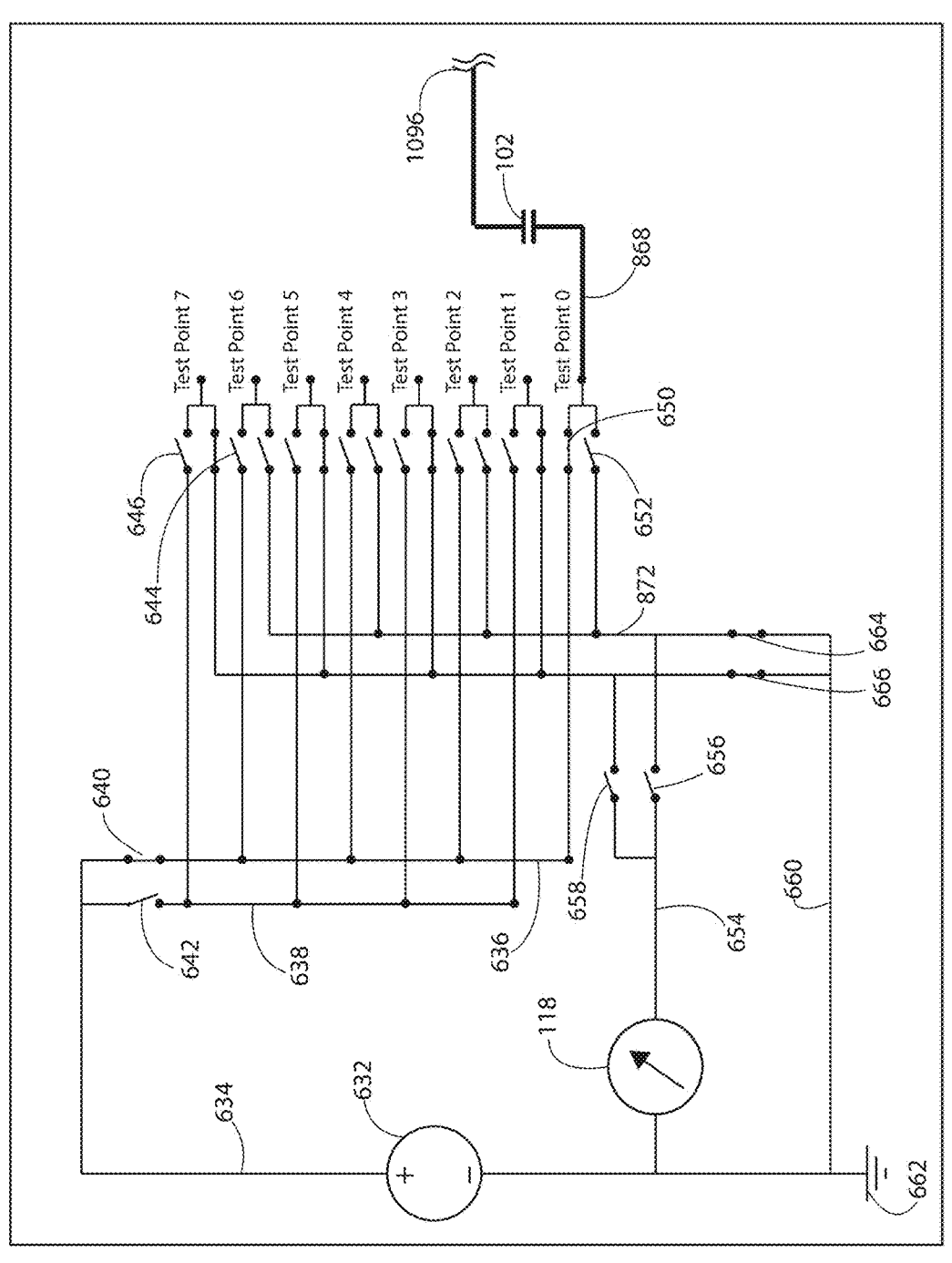
FIG. 10 is a schematic of an electrical circuit in accordance with various embodiments herein.
Figure 11:
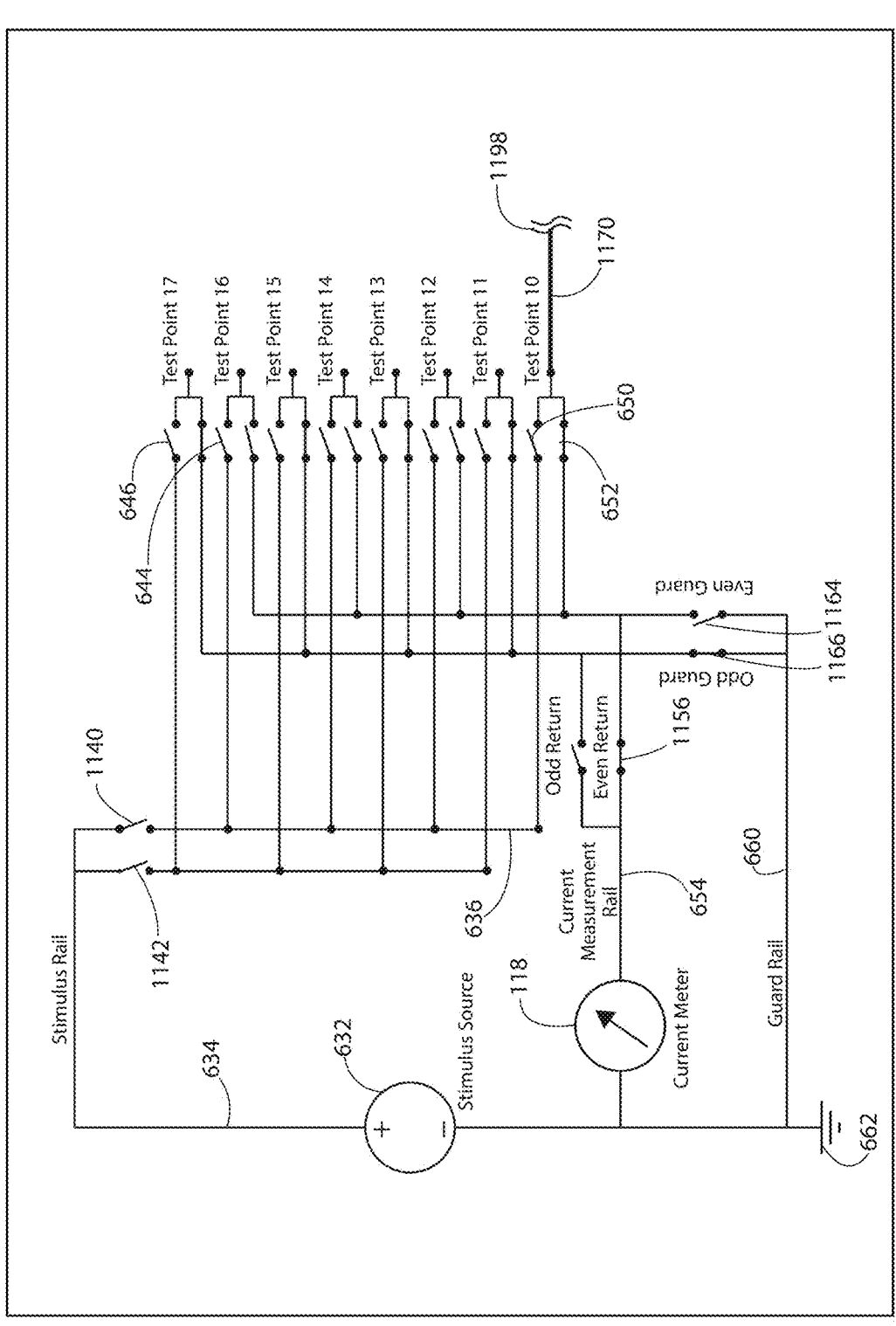
FIG. 11 is a schematic of an electrical circuit in accordance with various embodiments herein.

FIGS. 10 and 11 show an example of a test of UUT 102, specifically conducting a test between two test points that are in different groups. FIGS. 10 and 11 provide a simplified illustration of various embodiments where the capacitance between two test points of the UUT 102 are being tested, and the two points are not part of the same group. In FIGS. 10 and 11, the current capacitance test of UUT 102 is being conducted between "Test Point 0" 868 (FIG. 10), and "Test Point 10" 1170 (FIG. 11). It should be understood that point 1096 (FIG. 10) is connected with point 1198 (FIG. 11); however, they are shown separated between the figures for illustration purposes. Similarly, the stimulus relays 1140 and 1142 can be connected to the stimulus source 632, such as through stimulus rail 634.

In this example, the first group stimulus rail 636 is connected to the stimulus rail 634 by closing the first group stimulus relay 640. The "Test Point 0" input relay 650 is closed to connect to the positive side of the UUT 102 under the capacitance test. Since no return signal is being read from any of the test points in the first group including Test Point 0, the return relay 656 can be opened and the guard relay 664 can be closed to direct any capacitance to the guard rail 660. The output relays 652 for the remaining test points in the first group can be opened. In other embodiments, the output relays 652 for the remaining test points in the first group can be closed.

To complete the measurement process, the input relay 650 for Test Point 10 can be opened, and the output relay 652 can be closed. Since, the capacitance of Test Point 10 needs to be directed to the current meter 118, the return relay 1156 associated with the group including Test Point 10 can be closed. The guard relay 1164 associated with the group that includes Test Point 10 can be opened. The guard relay associated with groups not including Test Point 10 can be closed, such as shown in FIG. 10 and with guard relay 1166. The return relay associated with groups not including Test Point 10 can be opened. Stimulus relays 1140 and 1142 can be opened as no signal is transferred to the points shown in FIG. 11 via the stimulus rail. The configuration of FIGS. 10 and 11 can be implemented for testing the capacitance between two test points that are not in the same group.

Figure 12:
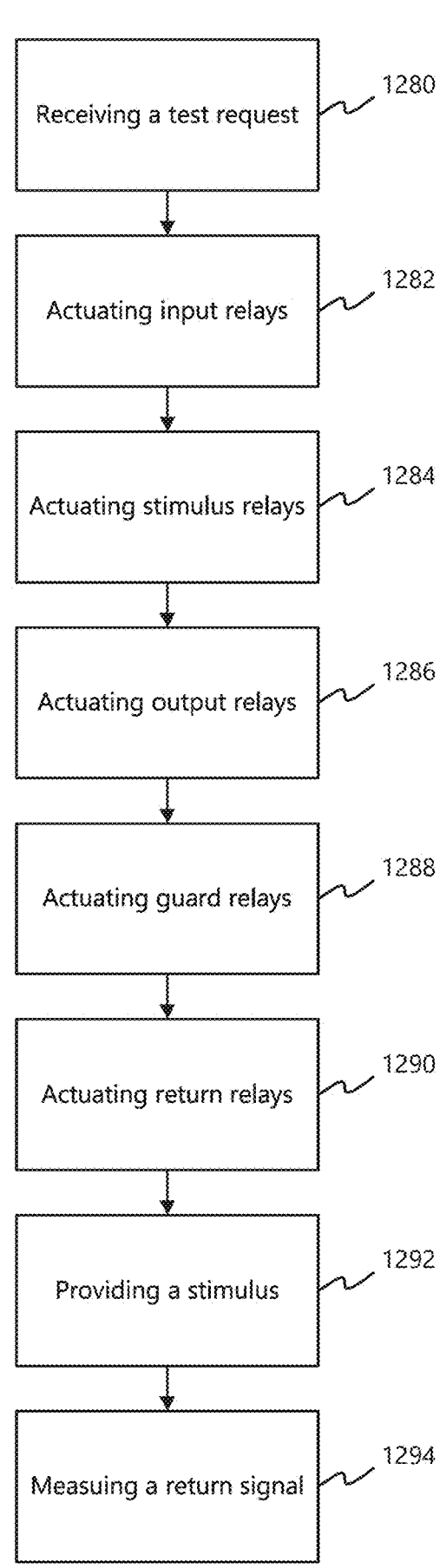
FIG. 12 is a flow chart of a method for capacitance testing in accordance with various embodiments herein.

With reference to FIG. 12, a method of conducting a capacitance measurement of a unit under test (UUT) using a partially guarded switching matrix is illustrated. The method commences with receiving a test request 1280 to initiate a capacitance measurement between selected test points of the UUT. In various embodiments the test request can include or identify two points in which the capacitance should be measured across. In response to the test request 1280, the controller executes a sequence of relay actuations to configure the measurement path and to appropriately direct currents associated with parasitic capacitance away from the current measurement circuit.

The method can include actuating input relays 1282. In one example, all of the input relays with the exception of an input relay for one of the test points (e.g. the first test point) to an open position. One input relay associated with one of the two test points (e.g. the input relay associated with the first test point) is actuated to a closed position, thereby connecting the desired test point to the stimulus source or a stimulus rail.

The method can include actuating one or more stimulus relays 1284 to a desired configured. Carrying on the example of the first test point and second test point, the stimulus relay associated with the first test point can be closed to complete the electrical path from the stimulus source to input relay of the first test point.

The method can include actuating one or more output relays 1286 to direct the return path to the desired locations. As an example, the output relays associated with groups that do not include a test point currently being tested can be closed to direct the current or path to a guard relay. Output relays are actuated 1286 to direct the return path of the measurement circuit through the current meter or, as needed, to the guard rail through the guard relays and the return relays.

The method can further include actuating one or more guard relays 1288 to connect non-selected test points to the guard rail or not. In embodiments where the test points are connect to the guard rail, any parasitic currents induced on unmeasured points are diverted away from the current meter.

In the same sequence, the method can further include actuating the return relays 1290, such as to selectively connect the return side of the stimulus either to the current measurement rail or not, depending on the configuration required to guard out undesired parasitic effects.

Following the actuation of the appropriate relays, a stimulus is provided 1292 from the stimulus source to the UUT via the selected path configured by the relay network. The system then measures a return signal 1294, typically current, with the current meter connected to the current measurement rail. The measured signal corresponds to the capacitance (or another electrical parameter, as applicable) between the selected test points, with parasitic contributions from unmeasured points substantially eliminated owing to the selective actuation of the guard and return relays. This method can allow for high-fidelity capacitance measurement using a reduced relay count, while maintaining a significant level of guarding against parasitic capacitance effects.

In the method steps or function of the controller, it should be understood that as described herein actuating a relay does not necessarily require mechanical movement or change, such as when a solid state relay is used. It should be further understood that actuating a relay to a specific position (e.g., open or closed) can include not actuating the relay to a new position if the relay is already in the desired position. In various embodiments, the controller maintains a log or record of the position of each relay. If a relay is already in the desired position, actuation of the relay need not take place to still be included in the scope of the step.

Various embodiments provided herein can include a method of conducting a capacitance test for a UUT using a switching matrix that includes a plurality of test points divided into at least two groups, each test point associated with an input relay and an output relay, a stimulus source coupled to a stimulus rail, a guard rail coupled to a first group guard relay and a second group guard relay, a current measurement rail coupled to a first group return relay and a second group return relay, and a current meter coupled to the current measurement rail.

In various embodiments, each input relay and each output relay comprises a solid-state relay or an electromechanical relay.

In various embodiments, the input and output terminology of the relays can be switched. In some cases, the input relays 650 can be referred to as output relays. Similarly, output relays 652 can be referred to as input relays. As long as each test point is associated with one input relay and one output relay, the terminology is irrelevant.

Groups and Test Point Configurations

In various different testing scenarios, a group can have one of four situations (1) the group does not include any test points being tested, (2) the group includes both points that are being tested, (3) the group includes one test point that is provided the stimulus signal, but no other test points are being tested, (4) the group includes one test point that provides the output or return signal, but no other test points are being tested. An example of (1) the group with no test points being tested is shown in FIG. 9 with the group including Test Points 10, 12, 14, and 16, and for the group including Test Points 11, 13, 15, and 17. An example of (2) the group include both test points being tested is shown in FIG. 8 with the group including Test Points 0 and 2. An example of (3) the group includes the stimulus test point is shown in FIG. 10 with the group including Test Point 0. An example of (4) the group includes the return test point is shown in FIG. 11 with the group including Test Point 10.

For the first situation of a group that does not include any test points that are currently being tested, all of the return signal can be directed to the guard rail. A stimulus relay associated with the group can be opened. A guard relay associated with the group can be closed to direct any capacitance to the guard rail. A return relay associated with the group can be opened to ensure that any capacitance is not directed to the current measurement rail or current meter. For each test point in the group, each of the input relays can be opened and each of the output relays can be closed.

For the second situation of a group that includes both test points that are currently being tested, the return signal can be directed to the current measurement rail 654 for measuring. A stimulus relay associated with the group can be closed to provide a stimulus to the UUT 102. A guard relay associated with the group can be opened to prevent the return signal from being directed to the guard rail. A return relay associated with the group can be closed to ensure that any capacitance is directed to the current measurement rail or current meter. For each test point in the group that is not being tested, each of the input relays can be opened and each of the output relays can be opened. For the test point that the stimulus signal is being directed to (e.g., Test Point 0 in FIG. 8), the input relay can be closed and the output relay can be opened. For the test point that the return signal is coming from (e.g., Test Point 2 in FIG. 8), the input relay can be opened and the output relay can be closed.

For the third situation of a group that includes the stimulus test point, but not the return test point, the return signal can be directed to the guard rail. A stimulus relay associated with the group can be closed to provide a stimulus to the UUT 102, such as stimulus relay 640 in FIG. 10 with Test Point 0 being the stimulus test point. A guard relay associated with the group can be closed direct any capacitance to the guard rail, such as shown in FIG. 10 with return relay 664. A return relay associated with the group can be opened. For each test point in the group that is not being tested, each of the input relays can be opened and each of the output relays can be opened. For the stimulus test point that the stimulus signal is being directed to (e.g., Test Point 0 in FIG. 10), the input relay can be closed and the output relay can be opened.

For the fourth situation of a group that includes the return test point, but not the stimulus test point, the return signal can be directed to the current measurement rail 654 for measuring. A stimulus relay associated with the group can be opened. A guard relay associated with the group can be opened to prevent the return signal from being directed to the guard rail. A return relay associated with the group can be closed to ensure that any capacitance is directed to the current measurement rail or current meter. For each test point in the group that is not being tested, each of the input relays can be opened and each of the output relays can be opened. For the test point that the return signal is coming from (e.g., Test Point 10 in FIG. 11), the input relay can be opened and the output relay can be closed.

The systems and methods provided herein can be configured to conduct multiple capacitance tests on a single UUT. Each of the capacitance tests can include a different combination of test points being tested. As such, each iteration of the capacitance testing can use a unique combination of test points. Therefore, the system can be configured to and the method can include actuating the relays to the desired configurations according to which tests points are currently being tested. The relays can be actuated into their desired configurations and then a test can be conducted. The process can be repeated until all combinations of tests points are tested, or until the desired combination of tests points are tested.

System Example:

In various embodiments, a system for capacitance testing of a unit under test. In various embodiments, the system can include a plurality of test points, each test point associated with an input relay and an output relay, such that the number of test points is equivalent to the number of input relays and the number of output relays, wherein the plurality of test points are divided into at least two groups. In various embodiments, the system can further include a stimulus source configured to provide a stimulus signal.

In various embodiments, the system can further include a stimulus rail, the stimulus rail electrically connected to each of the test points via the associated input relays, wherein the stimulus rail is electrically connected to the stimulus source. In various embodiments, the system can further include a first group guard relay electrically connected to each of the test points in a first group via the associated output relays. In various embodiments, the system can further include a second group guard relay electrically connected to each of the test points in a second group via the associated output relays. In various embodiments, the system can further include a guard rail, the guard rail coupled to the first group guard relay and the second group guard relay. In various embodiments, the system can further include a first group return relay electrically connected to each of the test points in a first group via the associated output relays. In various embodiments, the system can further include a second group return relay electrically connected to each of the test points in a second group via the associated output relays. In various embodiments, the system can further include a current measurement rail, the current measurement rail coupled to the first group return relay and the second group return relay. In various embodiments, the system can further include a current meter coupled to the current measurement rail. In various embodiments, the system can further include a controller operably coupled to the stimulus source, the input relays, the output relays, the guard relays, the return relays, and the current meter.

In various embodiments, in response to a test request between a first point in the second group and a second point in the second group, the controller is configured to: actuate the input relay for the first point to a closed position and the output relay for the first point to an open position; actuate the output relay for the second group to a closed position; actuate the input relays for the test points in the first group to an open position; actuate the output relays for the test points in the first group to a closed position; actuate the remaining input relays associated with test points in the second group to an open position; actuate the remaining output relays associated with test points in the second group to an open position; actuate the first group guard relay to a closed position; actuate the first group return relay to an open position; actuate the second group guard relay to an open position; actuate the second group return relay to a closed position; provide a stimulus via the stimulus source; and measure a return signal with the current meter.

In various embodiments, the controller is further configured to actuate all of the input relays of a group of test points not associated with a current test to an open position and all of the output relays of a group of test points not associated with the current test to a closed position.

In various embodiments, the system further comprises a first group stimulus relay and a second group stimulus relay, wherein the stimulus rail comprises a first group stimulus rail and a second group stimulus rail, the first group stimulus rail electrically connected to each of the input relays for the test points in the first group via first group stimulus relay, the second group stimulus rail electrically connected to each of the input relays for the test points in the second group via second group stimulus relay.

In various embodiments, the controller is further configured to implement a test by actuating a subset of input relays and a subset of output relays for only the test points associated with the measurement, leaving all other input or output relays in a state such that parasitic currents are redirected to the guard rail.

In various embodiments, when the number of groups is greater than two, and the system further comprises a corresponding group guard relay and a group return relay for each group.

In various embodiments, the system can further include a memory element operably coupled to the controller, wherein the memory element is configured to log results of multiple capacitance measurements.

Method Example:

The method can include receiving a test request to measure capacitance between a first test point and a second test point within a selected one of the groups. The method can include actuating an input relay for the first test point to a closed position and an output relay for the first test point to an open position. The method can include actuating an input relay for the second test point to an open position and an output relay for the second test point to a closed position. The method can include actuating input relays for test points in a non-selected group to open positions and actuating output relays for test points in the non-selected group to closed positions. The method can include actuating remaining input relays associated with test points in the selected group to open positions and actuating remaining output relays associated with test points in the selected group to open positions. The method can include actuating a guard relay for the non-selected group to a closed position and actuating a return relay for the non-selected group to an open position. The method can include actuating a guard relay for the selected group to an open position and actuating a return relay for the selected group to a closed position. The method can include providing a stimulus via the stimulus source to the stimulus rail. The method can include measuring a return signal with the current meter to determine capacitance between the first test point and the second test point, wherein parasitic currents from test points not associated with the current test are redirected to the guard rail and bypass the current meter.

In some embodiments, the method can further include using configuration data to automatically configure the grouping of the test points prior to initiating a test.

In some embodiments, the method can further include the step of logging the measured capacitance value with a time-stamp in a memory element operably coupled to the controller. In various embodiments, the memory element stores settings, data, and results associated with each test performed.

In some embodiments, the method can further include running additional capacitance tests between different combinations of test points, wherein parasitic capacitance from test points not included in the group or groups of the points being tested is directed to the guard rail.

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

As used herein, the recitation of numerical ranges by endpoints shall include all numbers subsumed within that range (e.g., 2 to 8 includes 2.1, 2.8, 5.3, 7, etc.).

The headings used herein are provided for consistency with suggestions under 37 CFR 1.77 or otherwise to provide organizational cues. These headings shall not be viewed to limit or characterize the invention(s) set out in any claims that may issue from this disclosure. As an example, although the headings refer to a "Field," such claims should not be limited by the language chosen under this heading to describe the so-called technical field. Further, a description of a technology in the "Background" is not an admission that technology is prior art to any invention(s) in this disclosure. Neither is the "Summary" to be considered as a characterization of the invention(s) set forth in issued claims.

The embodiments described herein are not intended to be exhaustive or to limit the invention to the precise forms disclosed in the following detailed description. Rather, the embodiments are chosen and described so that others skilled in the art can appreciate and understand the principles and practices. As such, aspects have been described with reference to various specific and preferred embodiments and techniques. However, it should be understood that many variations and modifications may be made while remaining within the spirit and scope herein.

The invention claimed is:

1. A system for capacitance testing of a unit under test (UUT), comprising:

a plurality of test points, each test point associated with an input relay and an output relay, such that the number of test points is equivalent to the number of input relays and the number of output relays, wherein the plurality of test points are divided into at least two groups;

a stimulus source configured to provide a stimulus signal;

a stimulus rail, the stimulus rail electrically connected to each of the test points via the associated input relays, wherein the stimulus rail is electrically connected to the stimulus source;

a first group guard relay electrically connected to each of the test points in a first group via the associated output relays;

a second group guard relay electrically connected to each of the test points in a second group via the associated output relays;

a guard rail, the guard rail coupled to the first group guard relay and the second group guard relay;

a first group return relay electrically connected to each of the test points in a first group via the associated output relays;

a second group return relay electrically connected to each of the test points in a second group via the associated output relays;

a current measurement rail, the current measurement rail coupled to the first group return relay and the second group return relay;

a current meter coupled to the current measurement rail; and a controller operably coupled to the stimulus source, the input relays, the output relays, the guard relays, the return relays, and the current meter.

2. The system of capacitance testing according to claim 1, wherein, in response to a test request between a first point in the second group and a second point in the second group, the controller is configured to:

(i) actuate the input relay for the first point to a closed position and the output relay for the first point to an open position;

(ii) actuate the output relay for the second group to a closed position;

(iii) actuate the input relays for the test points in the first group to an open position;

(iv) actuate the output relays for the test points in the first group to a closed position;

(v) actuate the remaining input relays associated with test points in the second group to an open position;

(vi) actuate the remaining output relays associated with test points in the second group to an open position;

(vii) actuate the first group guard relay to a closed position;

(viii) actuate the first group return relay to an open position;

(ix) actuate the second group guard relay to an open position;

(x) actuate the second group return relay to a closed position;

(xi) provide a stimulus via the stimulus source; and (xii) measure a return signal with the current meter.

3. The system of capacitance testing according to claim 2, wherein the controller is further configured to actuate all of the input relays of a group of test points not associated with a current test to an open position and all of the output relays of a group of test points not associated with the current test to a closed position.

4. The system of capacitance testing according to claim 1, further comprising a first group stimulus relay and a second group stimulus relay;

wherein the stimulus rail comprises a first group stimulus rail and a second group stimulus rail, the first group stimulus rail electrically connected to each of the input relays for the test points in the first group via first group stimulus relay, the second group stimulus rail electrically connected to each of the input relays for the test points in the second group via second group stimulus relay.

5. The system of capacitance testing according to claim 1, the controller is further configured to implement a test by actuating a subset of input relays and a subset of output relays for only the test points associated with the measurement, leaving all other input or output relays in a state such that parasitic currents are redirected to the guard rail.

6. The system of capacitance testing according to claim 1, wherein the number of groups is greater than two, and the system further comprises a corresponding group guard relay and a group return relay for each group.

7. The system of capacitance testing according to claim 1, wherein the guard rail is connected to a ground.

8. The system of capacitance testing according to claim 1, wherein each input relay and each output relay comprises a solid-state relay or an electromechanical relay.

9. The system of capacitance testing according to claim 1, wherein there are at least eight test points.

10. The system of capacitance testing according to claim 1, further comprising a memory element operably coupled to the controller, wherein the memory element is configured to log results of multiple capacitance measurements.

11. The system of capacitance testing according to claim 1, wherein the system is configured to measure capacitance in picofarads.

12. A system for capacitance testing of a unit under test (UUT), comprising:

a plurality of test points, each test point associated with an input relay and an output relay, such that the number of test points is equivalent to the number of input relays and the number of output relays, wherein the plurality of test points are divided into at least two groups;

a stimulus source configured to provide a stimulus signal;

a first stimulus rail, the first stimulus rail electrically connected to each of the test points in the first group via the associated input relays, wherein the first stimulus rail is electrically connected to the stimulus source via a first group stimulus relay;

a second stimulus rail, the first stimulus rail electrically connected to each of the test points in the second group via the associated input relays, wherein the first stimulus rail is electrically connected to the stimulus source via a second group stimulus relay;

a first group guard relay electrically connected to each of the test points in a first group via the associated output relays;

a second group guard relay electrically connected to each of the test points in a second group via the associated output relays;

a guard rail, the guard rail coupled to the first group guard relay and the second group guard relay;

a first group return relay electrically connected to each of the test points in a first group via the associated output relays;

a second group return relay electrically connected to each of the test points in a second group via the associated output relays;

a current measurement rail, the current measurement rail coupled to the first group return relay and the second group return relay;

a current meter coupled to the current measurement rail; and a controller operably coupled to the stimulus source, the input relays, the output relays, the guard relays, the return relays, and the current meter.

13. The system of capacitance testing according to claim 12, wherein, in response to a test request between a first point in the second group and a second point in the second group, the controller is configured to:

(i) actuate the input relay for the first point to a closed position and the output relay for the first point to an open position;

(ii) actuate the output relay for the second group to a closed position;

(iii) actuate the first group stimulus relay to a closed position;

(iv) actuate the second group stimulus relay to an open position;

(v) actuate the input relays for the test points in the first group to an open position;

(vi) actuate the output relays for the test points in the first group to a closed position;

(vii) actuate the remaining input relays associated with test points in the second group to an open position;

(viii) actuate the remaining output relays associated with test points in the second group to an open position;

(ix) actuate the first group guard relay to a closed position;

(x) actuate the first group return relay to an open position;

(xi) actuate the second group guard relay to an open position;

(xii) actuate the second group return relay to a closed position;

(xiii) provide a stimulus via the stimulus source; and (xiv) measure a return signal with the current meter.

14. The system of capacitance testing according to claim 13, wherein the controller is further configured to actuate all of the input relays of a group of test points not associated with a current test to an open position and all of the output relays of a group of test points not associated with the current test to a closed position.

15. The system of capacitance testing according to claim 12, the controller is further configured to implement a test by actuating a subset of input relays and a subset of output relays for only the test points associated with the measurement, leaving all other input or output relays in a state such that parasitic currents are redirected to the guard rail.

16. The system of capacitance testing according to claim 12, wherein the number of groups is greater than two, and the system further comprises a corresponding group guard relay and a group return relay for each group.

17. The system of capacitance testing according to claim 12, wherein the guard rail is connected to a ground.

18. The system of capacitance testing according to claim 12, wherein each input relay and each output relay comprises a solid-state relay or an electromechanical relay.

19. The system of capacitance testing according to claim 12, wherein there are at least eight test points.

20. The system of capacitance testing according to claim 12, further comprising a memory element operably coupled to the controller, wherein the memory element is configured to log results of multiple capacitance measurements.

* * * * *